(12) United States Patent
Wang (10) Patent No.: US 9,350,237 B2
(45) Date of Patent: May 24, 2016

(54) CONTROL CIRCUIT APPLICABLE TO POWER CONVERTER AND OPERATION METHOD THEREOF

(71) Applicant: Leadtrend Technology Corp., Hsin-Chu (TW)

(72) Inventor: Yu-Bin Wang, Hsin-Chu (TW)

(73) Assignee: Leadtrend Technology Corp., Zhubei, Hsinchu County (TW)

( * ) Notice: Subject to any disclaimer, the term of this patent is extended or adjusted under 35 U.S.C. 154(b) by 16 days.

(21) Appl. No.: 14/543,834

(22) Filed: Nov. 17, 2014

(65) Prior Publication Data

US 2015/0137775 A1    May 21, 2015

(30) Foreign Application Priority Data

Nov. 19, 2013  (TW) .............................. 102142107 A (51) Int. Cl.
  *H02M 1/42*   (2007.01)
  *H02M 3/156*  (2006.01)
  *H02M 1/08*   (2006.01)
  *H03K 17/284* (2006.01)
  *G05F 1/70*   (2006.01)
  *H02M 1/00*   (2006.01)

(52) U.S. Cl.
  CPC ................ *H02M 3/156* (2013.01); *H02M 1/08* (2013.01); *H03K 17/284* (2013.01); *H02M 2001/0009* (2013.01); *H02M 2001/0058* (2013.01); *Y02B 70/1491* (2013.01)

(58) Field of Classification Search
  CPC ......... G05F 1/70; H02M 1/42; H02M 1/4208; H02M 1/4225; Y02B 70/12; Y02B 70/126
  USPC ...................... 323/205, 207, 222, 299; 363/89
  See application file for complete search history.

(56) References Cited

U.S. PATENT DOCUMENTS

| 5,617,013 | A  | * | 4/1997  | Cozzi  | H02H 7/1255 323/207 |
| 8,129,958 | B2 | * | 3/2012  | Ku     | H02M 1/4225 323/207 |
| 8,513,926 | B2 | * | 8/2013  | Park   | G05F 1/70 323/207   |
| 9,099,925 | B2 | * | 8/2015  | Sugawara | |

* cited by examiner

*Primary Examiner* — Gary L Laxton
(74) *Attorney, Agent, or Firm* — Winston Hsu; Scott Margo (57) ABSTRACT

A control circuit includes an auxiliary pin for receiving an auxiliary voltage of an auxiliary winding of a power converter; a first detection unit for detecting a first time point when the auxiliary voltage begins resonance, and outputting a first detection signal according to the first time point; a second detection unit for detecting a second time point when the auxiliary voltage reaches a predetermined voltage, and outputting a second detection signal according to the second time point; a delay time controller for obtaining a delay time according to a output time difference between the first detection signal and the second detection signal, and outputting a driving signal with delay of the delay time when receiving the second detection signal; and a gate control signal generator for generating a gate control signal to a power switch of the power converter according to the driving signal of the delay time controller.

16 Claims, 7 Drawing Sheets

FIG. 7

CONTROL CIRCUIT APPLICABLE TO POWER CONVERTER AND OPERATION METHOD THEREOF

BACKGROUND OF THE INVENTION

1. Field of the Invention

The present invention relates to a control circuit applicable to a power converter and its operation method, and more particularly, to a control circuit and its operation method capable of reducing power consumption of a power converter.

2. Description of the Prior Art

Figure 1:
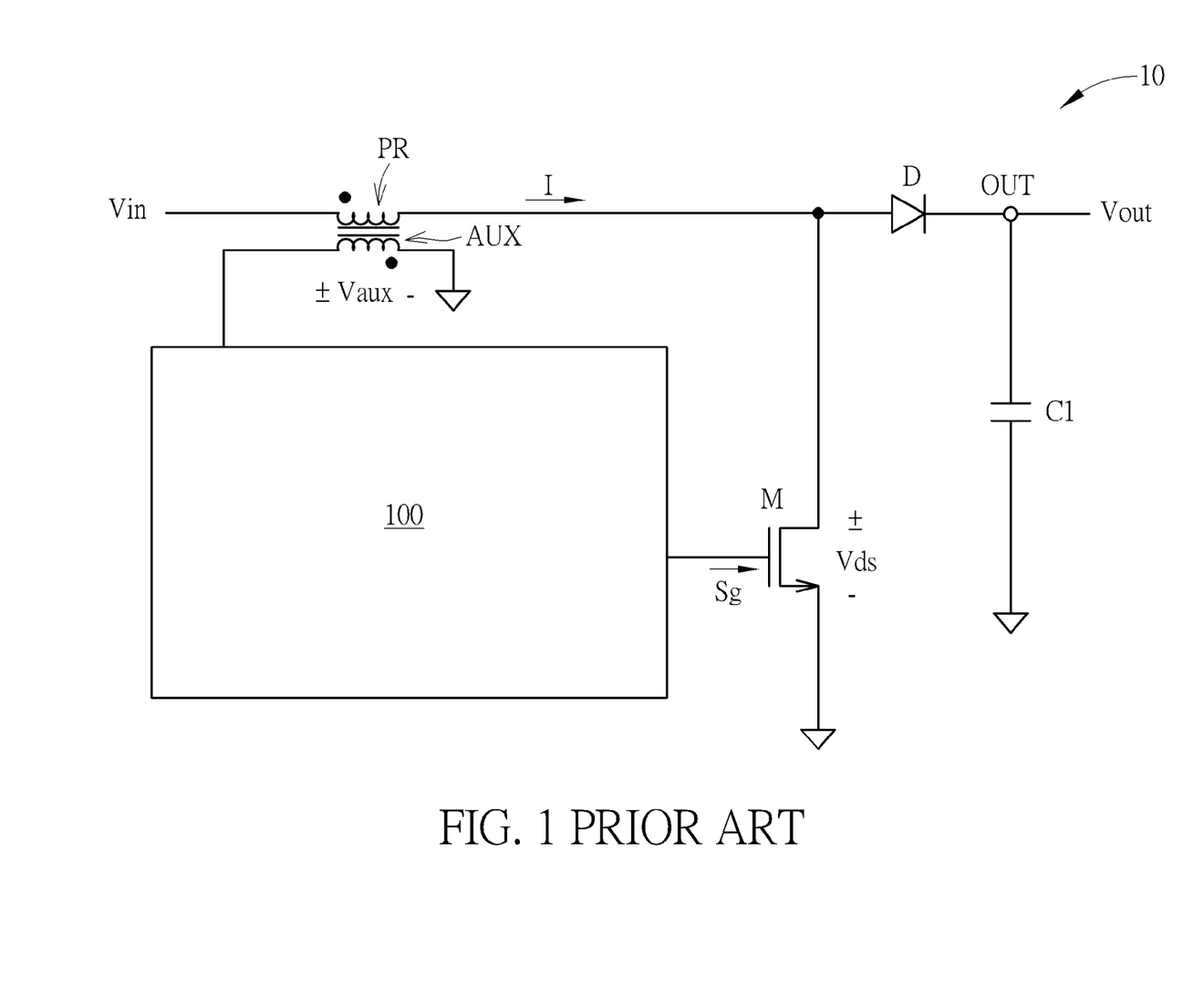
FIG. 1 is a diagram showing a power converter and a control circuit of the prior art.
Figure 2:
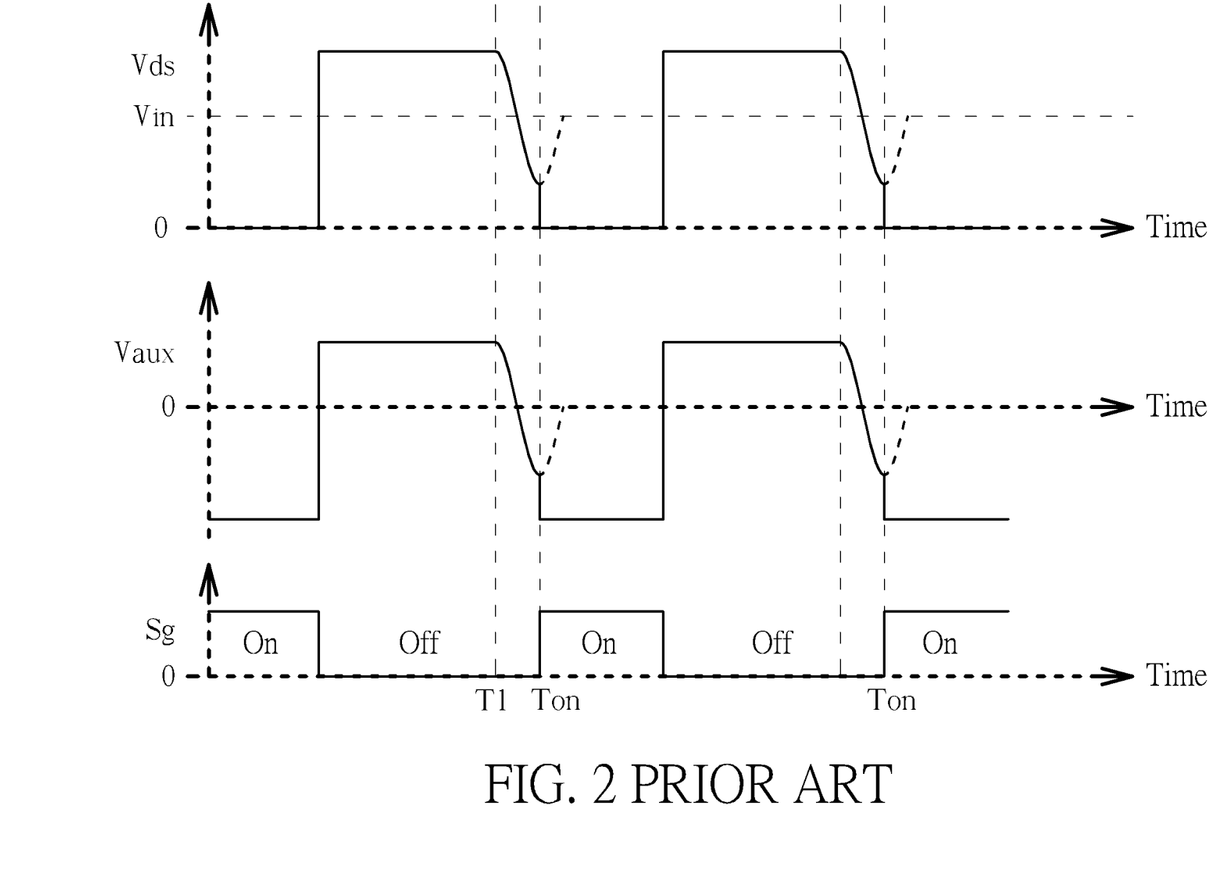
FIG. 2 is a diagram showing waveforms of related signals of the power converter and the control circuit in FIG. 1.

Please refer to FIG. 1 and FIG. 2. FIG. 1 is a diagram showing a power converter and a control circuit of the prior art. FIG. 2 is a diagram showing waveforms of related signals of the power converter and the control circuit in FIG. 1. As shown in FIG. 1, the power converter 10 comprises a primary winding PR, an auxiliary winding AUX, a power switch M, a diode D and a capacitor C1. The power switch M is coupled between the primary winding PR and ground. The diode D and the capacitor C1 are coupled to an output end OUT. The control circuit 100 is coupled to the auxiliary winding AUX and a gate end of the power switch M. The control circuit 100 is configured to turn on the power switch M according to an auxiliary voltage of the auxiliary winding AUX, and turn off the power switch M according to a duty cycle, in order to generate an output voltage Vout at the output end OUT of the power converter 10. As shown in FIG. 2, when the power converter 10 is operated in a discontinuous conduction mode (DCM), in order to reduce power consumption of the power converter 10, the control circuit 100 must turn on the power switch M at a time point Ton when the auxiliary voltage Vaux reaches a wave trough after beginning resonance (such as at time point T1), thus the power converter 10 can have smaller power consumption.

The control circuit 100 of the prior art determines the time point Ton when the auxiliary voltage Vaux reaches the wave trough after beginning resonance according to ideal values of circuit components of the power converter 10. However, parameters of the circuit components may have tolerances, such that the resonance frequency of the auxiliary voltage Vaux is affected by the tolerances, that is to say, the time point when the auxiliary voltage reaches the wave trough after beginning resonance may be different in different power converter. The control circuit 100 of the prior art cannot precisely determine the time point Ton when the auxiliary voltage Vaux reaches the wave trough after beginning resonance, such that the power converter 10 of the prior art has larger power consumption.

SUMMARY OF THE INVENTION

The present invention provides a control circuit applicable to a power converter, comprising an auxiliary pin, a first detection unit, a second detection unit, a delay time controller and a gate control signal generator. The auxiliary pin is for receiving an auxiliary voltage of an auxiliary winding of the power converter. The first detection unit is for detecting a first time point when the auxiliary voltage begins resonance, and outputting a first detection signal according to the first time point. The second detection unit is for detecting a second time point when the auxiliary voltage reaches a predetermined voltage, and outputting a second detection signal according to the second time point. The delay time controller is for obtaining a delay time according to a output time difference between the first detection signal and the second detection signal, and outputting a driving signal with delay of the delay time when receiving the second detection signal. The gate control signal generator is for generating a gate control signal to a power switch of the power converter according to the driving signal outputted by the delay time controller.

The present invention further provides an operation method of a control circuit applicable to a power converter, wherein the power converter comprises a primary winding, an auxiliary winding and a power switch coupled between the primary winding and ground. The method comprises receiving an auxiliary voltage of the auxiliary winding; detecting a first time point when the auxiliary voltage begins resonance, and outputting a first detection signal according to the first time point; detecting a second time point when the auxiliary voltage reaches a predetermined voltage, and outputting a second detection signal according to the second time point; obtaining a delay time according to a output time difference between the first detection signal and the second detection signal; and generating a gate control signal to the power switch according to an output time of the second detection signal and the delay time.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
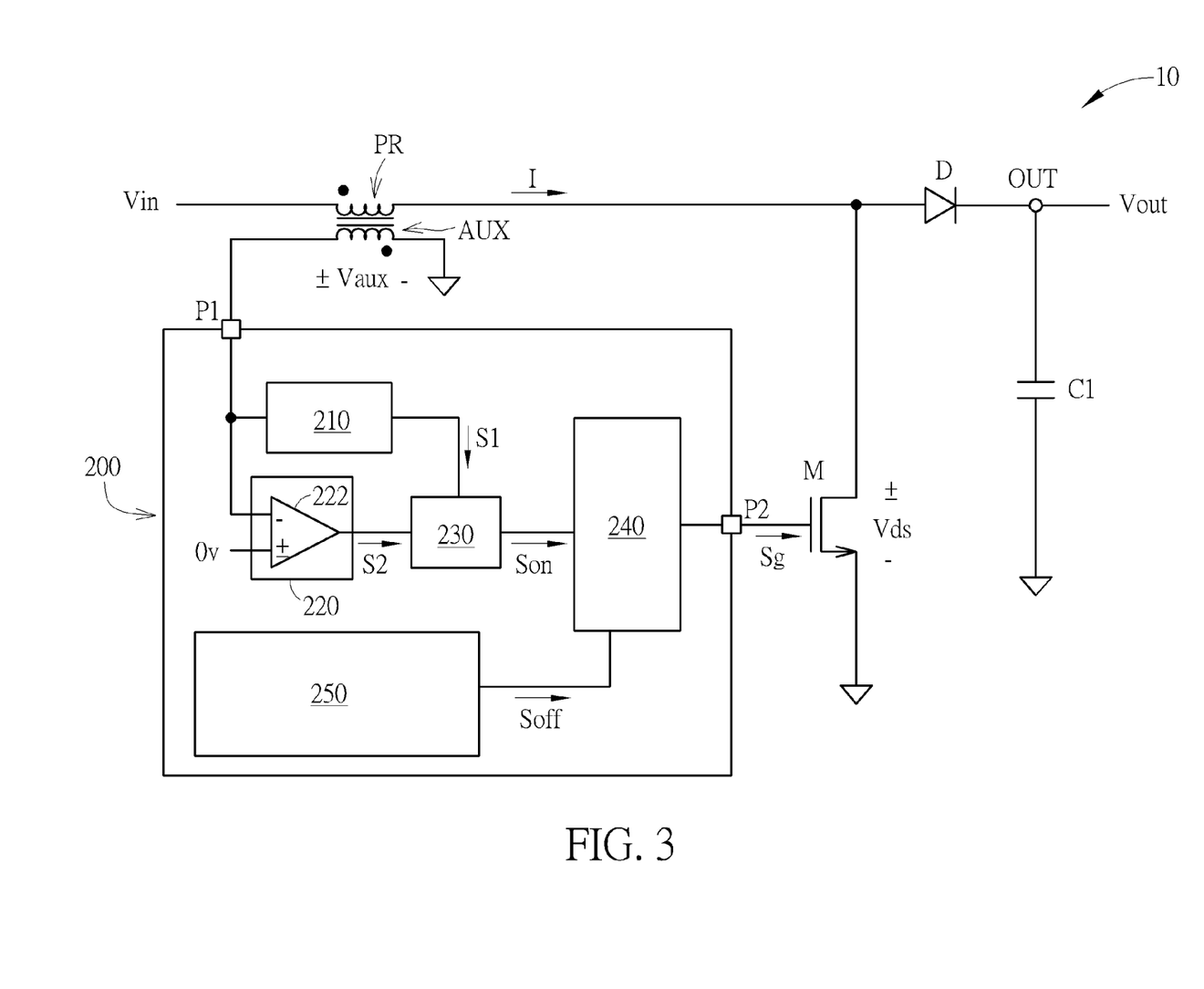
FIG. 3 is a diagram showing a control circuit applicable to a power converter according to a first embodiment of the present invention.

Please refer to FIG. 3. FIG. 3 is a diagram showing a control circuit applicable to a power converter according to a first embodiment of the present invention. As shown in FIG. 3, the power converter 10 comprises a primary winding PR, an auxiliary winding AUX, a power switch M, a diode D and a capacitor C1. The power switch M is coupled between the primary winding PR and ground. The diode D and the capacitor C1 are coupled to an output end OUT. The control circuit 200 comprises an auxiliary pin P1, a first detection unit 210, a second detection unit 220, a delay time controller 230, a gate control signal generator 240 and a gate pin P2. The auxiliary pin P1 is for receiving an auxiliary voltage Vaux of the auxiliary winding AUX of the power converter 10. The first detection unit 210 is for detecting a first time point when the auxiliary voltage Vaux begins resonance, and outputting a first detection signal S1 according to the first time point. The second detection unit 220 is for detecting a second time point when the auxiliary voltage Vaux reaches a predetermined voltage, and outputting a second detection signal S2 according to the second time point. The delay time controller 230 is for obtaining a delay time according to an output time difference between the first detection signal S1 and the second detection signal S2, and outputting a driving signal Son with delay of the delay time when receiving the second detection signal S2. The gate control signal generator 240 is for generating a gate control signal Sg to the power switch M of the power converter 10 according to the driving signal Son outputted by the delay time controller 230. The gate pin P2 is coupled between the gate control signal generator 240 and a gate end of the power switch M, and the gate control signal Sg is transmitted to the power switch M via the gate pin P2.

Figure 4:
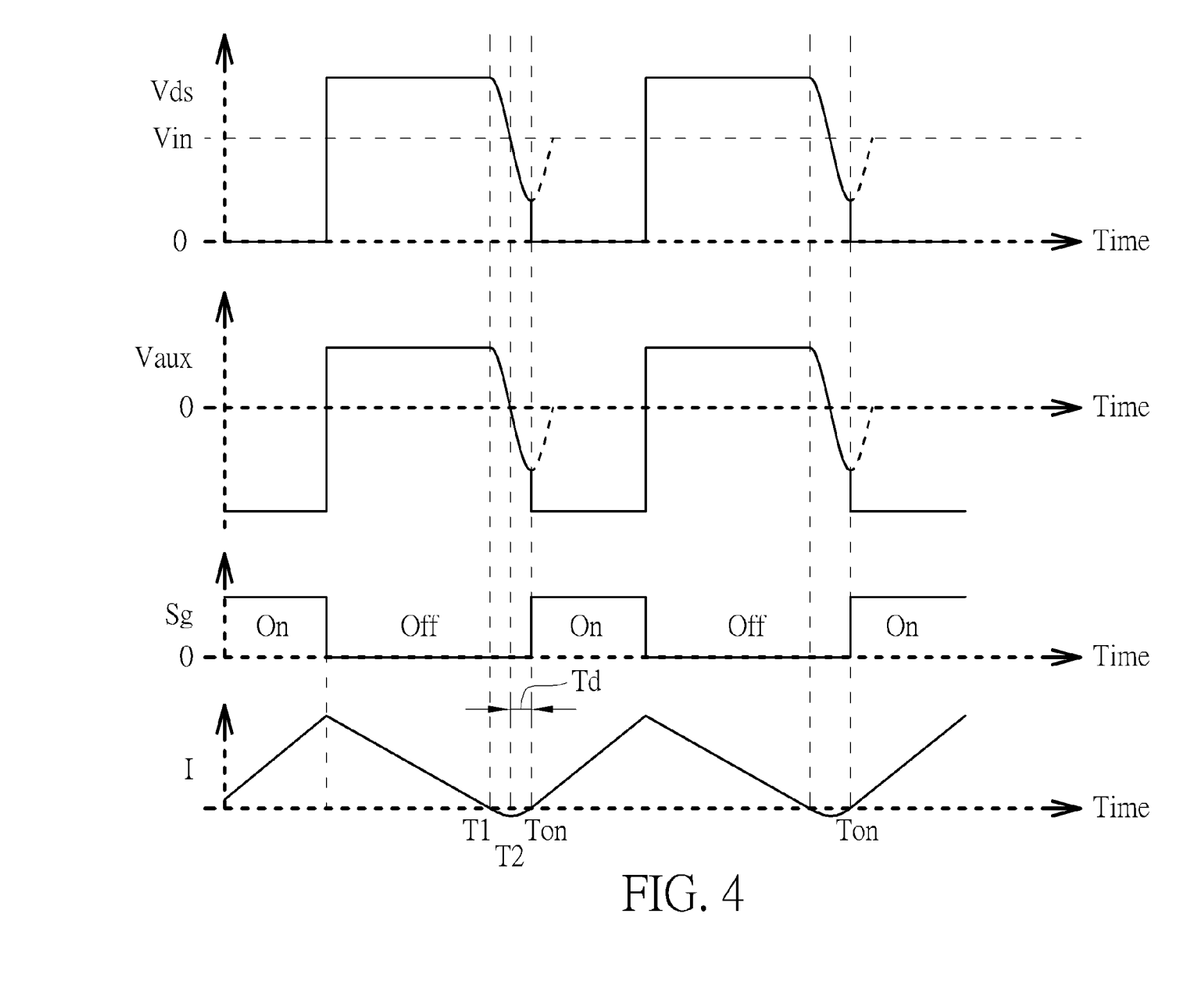
FIG. 4 is a diagram showing waveforms of related signals of the power converter and the control circuit in FIG. 3.

When the power converter 10 is operated in a discontinuous conduction mode (DCM), the control circuit 200 of the present invention can precisely turn on the power switch M at a time point when the auxiliary voltage Vaux reaches a wave trough after beginning resonance (that is also a time point when a cross voltage Vds between two ends of the power switch M is at a smallest level), in order to reduce power consumption of the power converter 10. For example, please refer to FIG. 4, and refer to FIG. 3 as well. FIG. 4 is a diagram showing waveforms of related signals of the power converter and the control circuit in FIG. 3. Since the first detection unit 210 is coupled to the auxiliary pin P1, the first detection unit 210 can detecting whether the auxiliary voltage Vaux starts to have a voltage drop when the auxiliary voltage Vaux is stably kept at a fixed value. If the auxiliary voltage Vaux starts to have a voltage drop at time point T1, it means the auxiliary voltage Vaux begins resonance (a level of current I flowing through the primary winding PR is zero at the mean time), the first detection unit 210 outputs the first detection signal S1 to the delay time controller 230 at the first time point T1. The second detection unit 220 comprises a comparator 222 for comparing the auxiliary voltage Vaux with the predetermined voltage (such as 0 volt). When the auxiliary voltage Vaux reaches 0 volt at the second time point T2, the second detection unit 220 outputs the second detection signal S2 to the delay time controller 230 at the second time point T2. The delay time controller 230 can obtain the delay time Td according to the output time difference between the first detection signal S1 and the second detection signal S2 (that is a time difference between the first time point T1 and the second time point T2), and output the driving signal Son with delay of the delay time Td when receiving the second detection signal S2. Since a resonance waveform of the auxiliary voltage Vaux is a cosine waveform, and the time difference between the first time point T1 and the second time point T2 is equal to one half of a time length of the resonance waveform of the auxiliary voltage Vaux starting from a wave crest till next wave trough, the delay time controller 230 can set a time length of the delay time Td equal to the time difference between the first time point T1 and the second time point T2, such that the driving signal Son can be outputted at a time point Ton when the auxiliary voltage Vaux reaches the wave trough after beginning resonance. The gate control signal generator 240 then can pull up a voltage level of the gate control signal Sg to precisely turn on the power switch when the auxiliary voltage Vaux reaches the wave trough after beginning resonance, according to the driving signal Son outputted by the delay time controller 230.

According to the above arrangement, even parameters of circuit components of the power converter 10 have tolerances, and the resonance frequency of the auxiliary voltage Vaux is affected by the tolerances, the control circuit 200 applicable to the power converter 10 of the present invention still can precisely determine the time point Ton when the auxiliary voltage Vaux reaches the wave trough after beginning resonance.

In addition, the control circuit 200 can further comprises a turn-off control circuit 250 for generating a turn-off signal Soff according to a duty cycle of the power converter 10. The gate control signal generator 240 can pull down the voltage level of the gate control signal Sg according to the turn-off signal Soff outputted by the turn-off control circuit 250, in order to turn off the power switch M.

Figure 5:
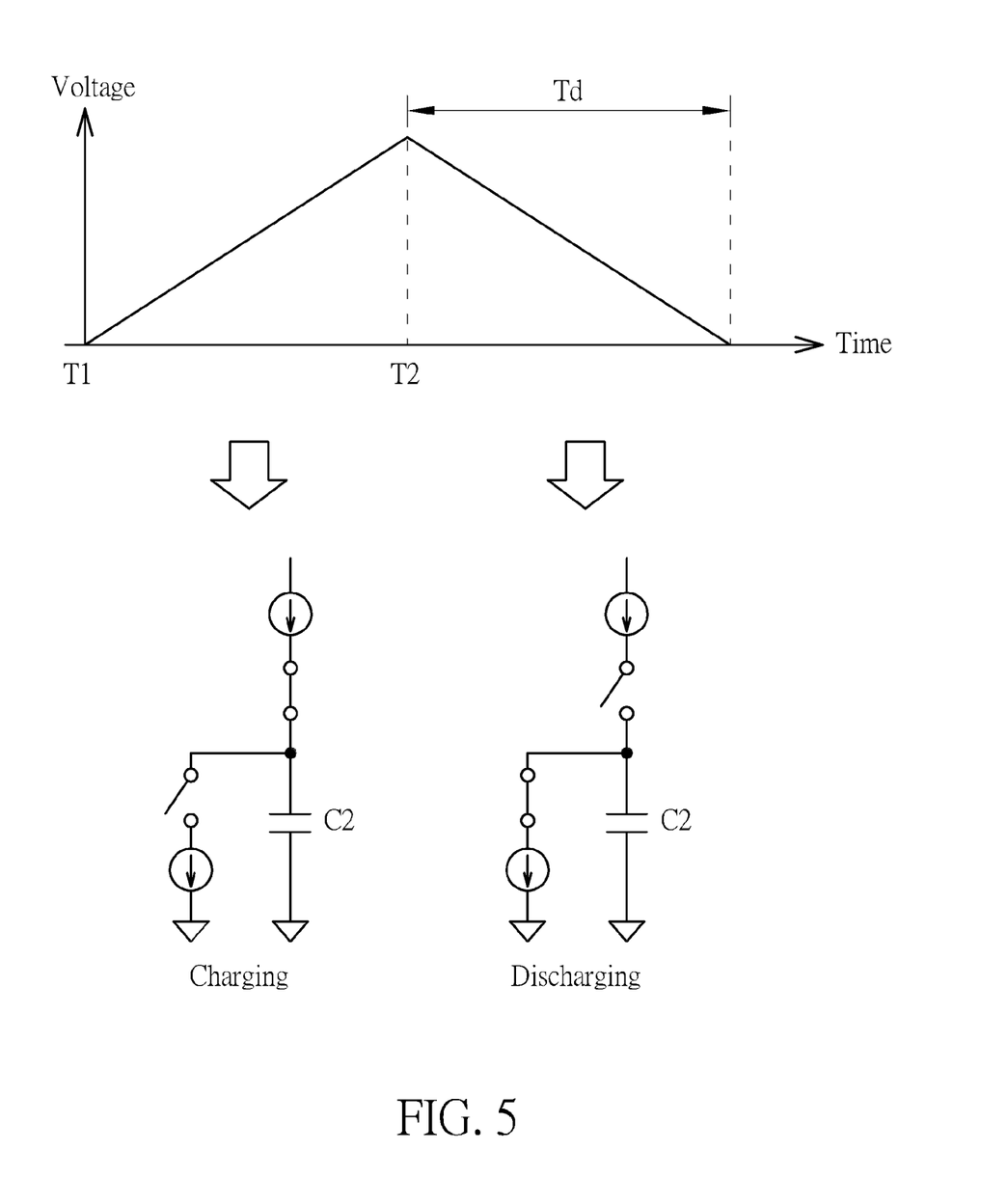
FIG. 5 is a diagram illustrating a capacitor of a delay time controller performing charging and discharging operations according to an output time difference between a first detection signal and a second detection signal.

On the other hand, the delay time controller 230 of the present invention can comprise a digital counter for counting the output time difference between the first detection signal S1 and the second detection signal S2, in order to obtain the delay time Td. Or, the delay time controller 230 can comprise a capacitor for performing charging and discharging operations according to the output time difference between the first detection signal S1 and the second detection signal S2, in order to obtain the delay time Td. For example, as shown in FIG. 5, a capacitor C2 can start to perform charging operation at the first time point T1, and start to perform discharging operation at the second time point T2, thus the time length of the delay time Td is equal to a time length from the second time point T2 (when the capacitor C2 starts to perform discharging operation) till a voltage level of the capacitor C2 drops to a voltage level before the charging operation.

Figure 6:
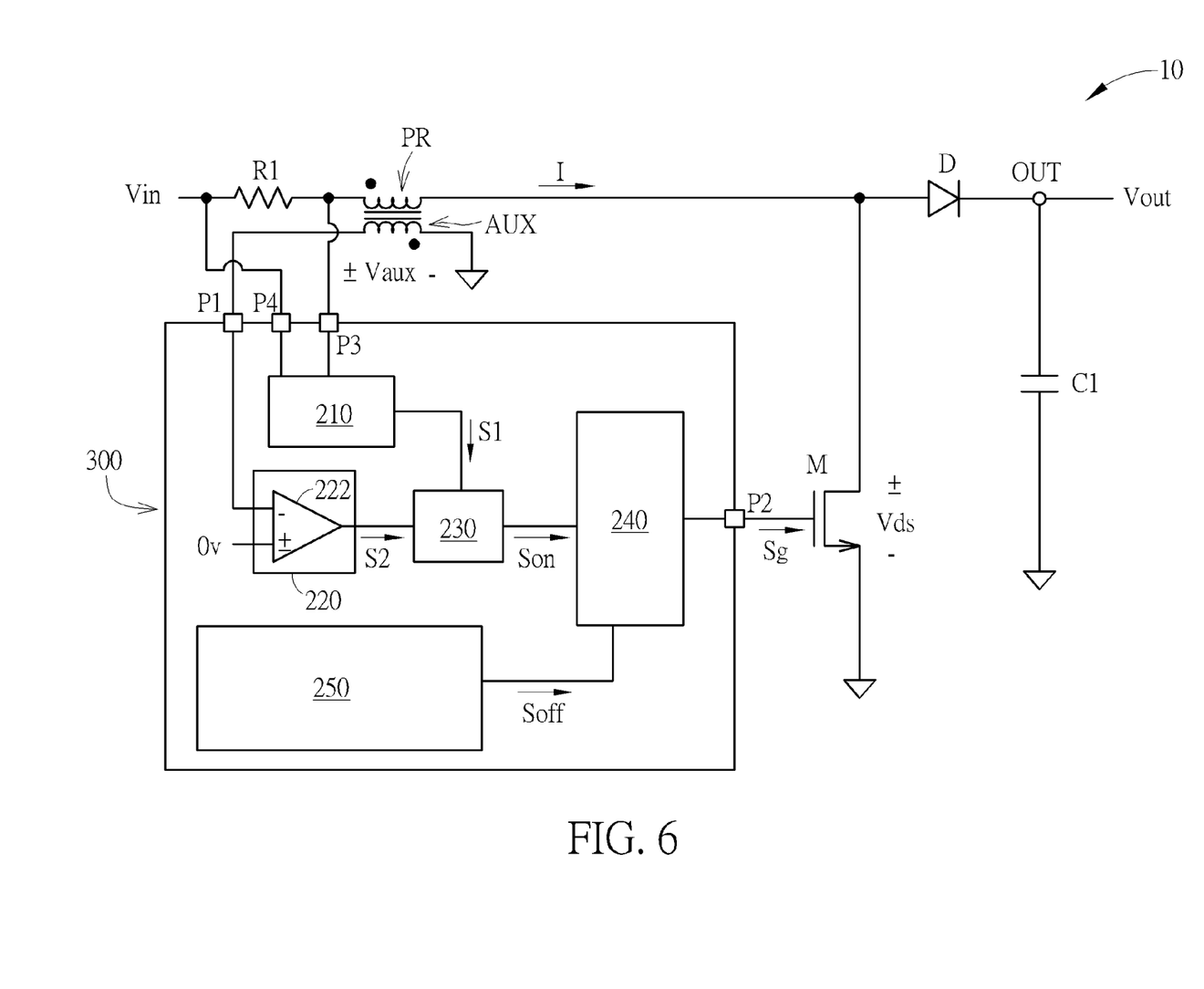
FIG. 6 is a diagram showing a control circuit applicable to a power converter according to a second embodiment of the present invention.

Please refer to FIG. 6, and refer to FIG. 4 as well. FIG. 6 is a diagram showing a control circuit applicable to a power converter according to a second embodiment of the present invention. As shown in FIG. 6, in addition to detect the first time point T1 according to the auxiliary voltage Vaux, the first detection unit 210 also can couple to a detection resistor R1 of the primary winding PR of the power converter 10 via pins P3 and P4 of the control circuit 300, for detecting the first time point T1 when the auxiliary voltage Vaux begins resonance according to the level of current I passing through the primary winding PR. Since the level of current I flowing through the primary winding PR is zero at the first time point T1, the first detection unit 210 can detect the first time point T1 when the level of current I flowing through the primary winding PR is zero, in order to further output the first detection signal S1 at the first time point T1.

Figure 7:
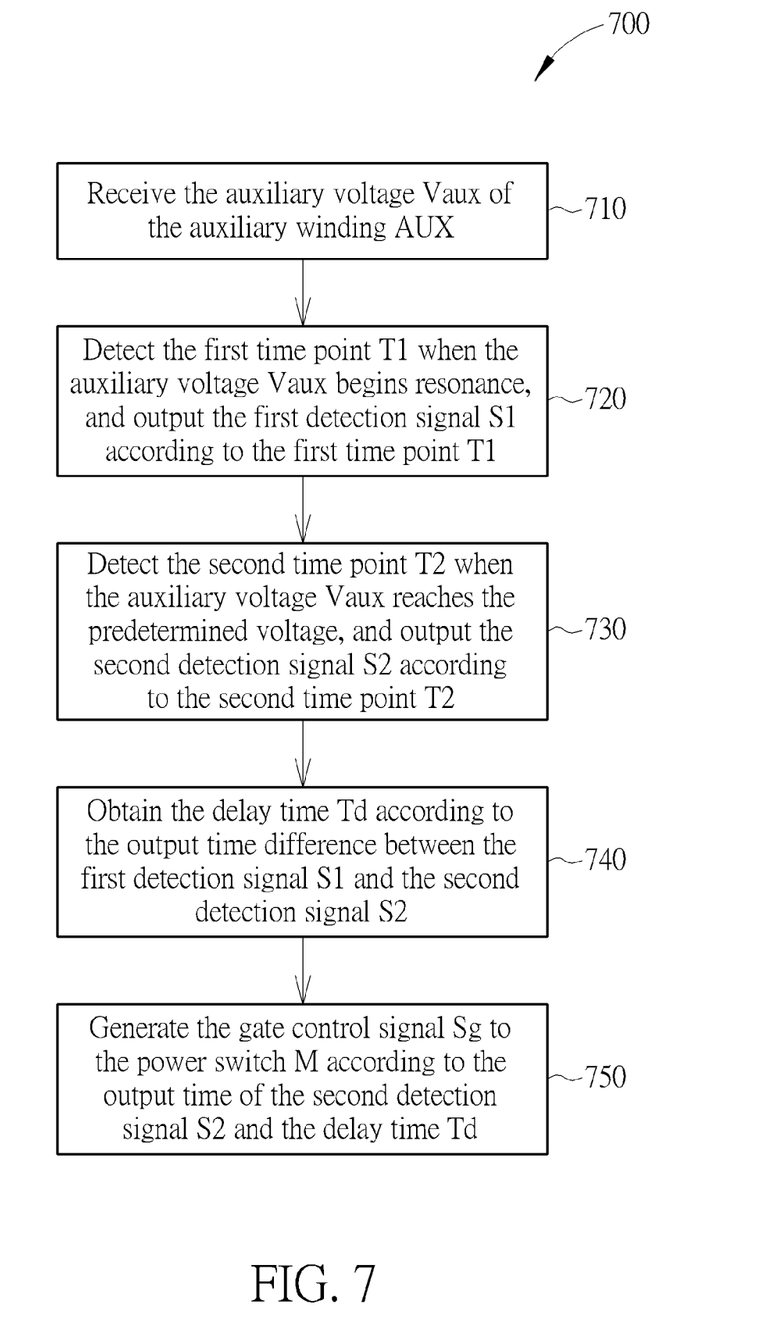
FIG. 7 is a flowchart showing an operation method of a control circuit applicable to a power converter of the present invention.

Please refer to FIG. 7. FIG. 7 is a flowchart 700 showing an operation method of the control circuit applicable to the power converter of the present invention. The flowchart of the operation method of the control circuit applicable to the power converter of the present invention comprises the following steps:

Step 710: Receive the auxiliary voltage Vaux of the auxiliary winding AUX;

Step 720: Detect the first time point T1 when the auxiliary voltage Vaux begins resonance, and output the first detection signal S1 according to the first time point T1;

Step 730: Detect the second time point T2 when the auxiliary voltage Vaux reaches the predetermined voltage, and output the second detection signal S2 according to the second time point T2;

Step 740: Obtain the delay time Td according to the output time difference between the first detection signal S1 and the second detection signal S2; and Step 750: Generate the gate control signal Sg to the power switch M according to the output time of the second detection signal S2 and the delay time Td.

In contrast to the prior art, the control circuit for power converter and the operation method of the present invention can adjust the time length of the delay time according to the output time difference between the first detection signal and the second detection signal, so as to precisely turn on the power switch at the time point when the auxiliary voltage reaches the wave trough after beginning resonance, such that the power converter can have smaller power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit applicable to a power converter, comprising:
   an auxiliary pin for receiving an auxiliary voltage of an auxiliary winding of the power converter;
   a first detection unit for detecting a first time point when the auxiliary voltage begins resonance, and outputting a first detection signal according to the first time point;
   a second detection unit for detecting a second time point when the auxiliary voltage reaches a predetermined voltage, and outputting a second detection signal according to the second time point;
   a delay time controller for obtaining a delay time according to an output time difference between the first detection signal and the second detection signal, and outputting a driving signal with delay of the delay time when receiving the second detection signal; and
   a gate control signal generator for generating a gate control signal to a power switch of the power converter according to the driving signal outputted by the delay time controller.

2. The control circuit of claim 1, wherein the first detection unit is coupled to the auxiliary pin, for detecting the first time point according to a voltage drop of the auxiliary voltage.

3. The control circuit of claim 1, wherein the first detection unit is coupled to a detection resistor of a primary winding of the power converter, for detecting the first time point according to a level of current passing through the primary winding.

4. The control circuit of claim 1, wherein the delay time controller comprises a digital counter for counting the output time difference between the first detection signal and the second detection signal, in order to obtain the delay time.

5. The control circuit of claim 1, wherein the delay time controller comprises a capacitor for performing charging and discharging operations according to the output time difference between the first detection signal and the second detection signal, in order to obtain the delay time.

6. The control circuit of claim 1, wherein the predetermined voltage is 0 volt.

7. The control circuit of claim 1, further comprising:
   a gate pin, wherein the gate control signal is transmitted to the power switch via the gate pin.

8. The control circuit of claim 1, wherein the second detection unit comprises a comparator for comparing the auxiliary voltage with the predetermined voltage, in order to output the second detection signal.

9. The control circuit of claim 1, wherein the power converter is operated in a discontinuous conduction mode (DCM).

10. An operation method of a control circuit applicable to a power converter, the power converter comprising a primary winding, an auxiliary winding and a power switch coupled between the primary winding and ground, the method comprising:
    receiving an auxiliary voltage of the auxiliary winding;
    detecting a first time point when the auxiliary voltage begins resonance, and outputting a first detection signal according to the first time point;
    detecting a second time point when the auxiliary voltage reaches a predetermined voltage, and outputting a second detection signal according to the second time point;
    obtaining a delay time according to an output time difference between the first detection signal and the second detection signal; and
    generating a gate control signal to the power switch according to an output time of the second detection signal and the delay time.

11. The operation method of claim 10, wherein detecting the first time point when the auxiliary voltage begins resonance comprises:
    detecting the first time point according to a voltage drop of the auxiliary voltage.

12. The operation method of claim 10, wherein detecting the first time point when the auxiliary voltage begins resonance comprises:
    detecting the first time point according to a level of current passing through the primary winding.

13. The operation method of claim 10, wherein obtaining the delay time according to the output time difference between the first detection signal and the second detection signal comprises:
    utilizing a digital counter for counting the output time difference between the first detection signal and the second detection signal, in order to obtain the delay time.

14. The operation method of claim 10, wherein obtaining the delay time according to the output time difference between the first detection signal and the second detection signal comprises:
    utilizing a capacitor for performing charging and discharging operations according to the output time difference between the first detection signal and the second detection signal, in order to obtain the delay time.

15. The operation method of claim 10, wherein the predetermined voltage is 0 volt.

16. The operation method of claim 10, wherein generating the gate control signal to the power switch according to the output time of the second detection signal and the delay time comprises:
    generating the gate control signal to the power switch with delay of the delay time when the second detection signal is outputted, in order to turn on the power switch.

* * * * *